United States Patent [19]
Oji

[11] Patent Number: 5,869,862
[45] Date of Patent: Feb. 9, 1999

[54] HIGH INTEGRATION SEMICONDUCTOR DEVICE

[75] Inventor: Hiroshi Oji, Ukyo-ku, Japan

[73] Assignee: Rohm Co., Ltd., Kyoto, Japan

[21] Appl. No.: 814,969

[22] Filed: Mar. 11, 1997

[30] Foreign Application Priority Data

Mar. 15, 1996 [JP] Japan .................................. 8-059309

[51] Int. Cl.$^6$ .................................................. H01L 29/76
[52] U.S. Cl. ........................................... 257/314; 257/315
[58] Field of Search ................................. 257/316–319, 257/314, 315

[56] References Cited

U.S. PATENT DOCUMENTS

| | | | |
|---|---|---|---|
| 4,807,017 | 2/1989 | Ema et al. | 257/296 |
| 5,248,891 | 9/1993 | Takato et al. | 257/296 |
| 5,556,799 | 9/1996 | Hong | 257/316 |

Primary Examiner—Mahshid D. Saadat
Assistant Examiner—S. V. Clark
Attorney, Agent, or Firm—Merchant, Gould, Smith, Edell, Welter & Schmidt

[57] ABSTRACT

Control gate electrodes 12 are formed on field oxidation layers 19. Anisotropic etching is carried out by covering all the regions except for a source region by photo-resist layers 31 and using the control gate electrodes 12 as a mask. Concave parts 20 are formed in the inner side of the control gate electrodes 12 of the field oxidation layer 19. A source region 4b is formed by carrying out ion implantation. Drain regions 3 and a source region 4 are formed by removing the photo-resist layers 31, and by carrying out ion implantation using the control gate electrodes 12 as a mask. The source region is formed by removing a part of the isolation region positioned adjacently to the source region located in a peripheral part of the control gate electrodes 12. As a result, it is possible to reduce the distance between two of the control gate electrodes positioned adjacently as well as increasing integration level of the nonvolatile memory devices.

3 Claims, 8 Drawing Sheets

HIGH INTEGRATION SEMICONDUCTOR DEVICE

CROSS-REFERENCE TO RELATED APPLICATIONS

The entire disclosure of Japanese Patent Application No. Hei 8-059309 filed on Mar. 15, 1996 including specification, claims, drawings and summary are incorporated herein by reference in its entirely.

BACKGROUND OF INVENTION

1. Field of the Invention

This invention relates to a semiconductor device, more specifically an increased integration level of the semiconductor memory device.

2. Description of the Related Art

A conventional nonvolatile memory is described with reference to FIG. 7A, 7B and FIG. 8 hereinbelow. FIG. 7A shows a plan view of the nonvolatile memory 35. Also, FIG. 7B is a cross-sectional view of a line VIIB—VIIB of the nonvolatile memory 35 shown in FIG. 7A. The nonvolatile memory 35 having a plurality of memory elements 35a, 35b which carry out data-storage and data-erase by injecting electrons to a floating gate electrode 11 and pull out the electrons therefrom as shown in FIG. 7B. A source region of each element is formed extendedly as in a column as one region as shown in FIG. 7A and FIG. 7B. FIG. 8 is a cross-sectional view of a line VIII—VIII of the nonvolatile memory 35 shown in FIG. 7A.

The field oxidation layers 19 are isolated regions as shown in the figures. The floating gate electrode 11 is formed partially on the field oxidation layers 19. Also, control gate electrodes 12 are formed as word lines extendedly in a column as one electrode on the field oxidation layers 19.

The source region is formed by carrying out ion implantation by utilizing the control gate electrodes 12 as a mask in the nonvolatile memory 35. As a result, the source region can not be formed under the field oxidation layers 19 because implanted ions can not reach to the field oxidation layer 19. Consequently, it is necessary to maintain a certain distance (a distance $\beta 2$) between the control gates located adjacently in order to form the word lines properly (see FIG. 8).

Further, an additional distance $\beta 1$ is required between the control gates located adjacently as a margin in consideration of mis-alignment of the mask. That is, the width of the source region 4 is narrowed for a certain width when the control gate electrode 12 is formed out of a predetermined position. In order to avoid such a case, a certain width of margin for the narrowed width expected is required.

In addition, a passivation layer which covers the surface is formed unevenly with steps when the distance between the adjacent control gates becomes large as described above. As a result, there is slight probability of disconnection of wiring when a wiring layer is formed on the passivation layer.

SUMMARY OF THE INVENTION

It is an object of the present invention to increase the integration level of a semiconductor device, as well as forming a passivation layer flatly thereon. Specifically, the object is to increase the integration level and to form a passivation layer flatly in a semiconductor device comprising a plurality of elements, each of the elements having a source region formed as a diffusion region for mutually interconnecting the elements. More specifically, the object of the present invention is to increase the integration level and to form a flat passivation layer by shortening the distance between electrodes formed extendedly the source region formed, in a semiconductor device comprising a plurality of elements, each of the elements having a source region formed as a diffusion region for mutually interconnecting the elements.

In accordance with characteristics of the present invention, a semiconductor memory device has a plurality of semiconductor memory elements arranged in rows and columns as a matrix structure in a semiconductor substrate divided into a plurality of element formation regions by isolation regions, wherein a first diffusion region of the semiconductor memory elements positioned adjacently in a row is formed extendedly in the direction of a column as one region, wherein electrodes of the semiconductor memory elements arranged in a column are formed extendedly in the column as one electrode, wherein a part of the isolation region positioned adjacent to the first diffusion region located in a peripheral part of the electrodes is removed, and wherein the first diffusion region is formed in the element formation region positioned under the isolation region removed previously.

Also, in accordance with characteristics of the present invention, a semiconductor memory device has a plurality of semiconductor memory elements arranged in rows and columns as a matrix structure in a semiconductor substrate divided into a plurality of element formation regions by isolation regions, wherein a first diffusion region of the semiconductor memory elements positioned adjacently in a row is formed extendedly in the direction of a column as one region, wherein electrodes in each of the semiconductor memory elements are composed by electrodes formed extendedly in a column as one electrode, wherein a part of the isolation region positioned adjacent to the first diffusion region located in a peripheral part of the electrodes is removed, and wherein the first diffusion region is formed of substantially uniform width in the direction of the column.

Further, in accordance with characteristics of the present invention, a method for manufacturing a semiconductor memory device comprises the steps of:

dividing a semiconductor substrate of a first conductive type into element formation regions and isolation regions by forming field oxidation layers on a surface of the semiconductor substrate, forming linear electrodes extending over a plurality of the element formation regions and located on the isolation regions, covering a region positioned between the linear electrodes by photo-resist layers except for a part of the region where a diffusion region is to be formed, carrying out etching part of the field oxidation layers, and forming the diffusion regions of a second conductive type.

In accordance with characteristics of the present invention, a method for manufacturing a semiconductor memory device having a plurality of semiconductor memory elements arranged in rows and columns as a matrix structure in a semiconductor substrate divided into a plurality of element formation regions by isolation regions, comprises the steps of;

forming electrodes for the semiconductor memory elements, the electrodes of the semiconductor memory elements arranged as in a column being formed extendedly in the direction of the column as one electrode, removing a part of the isolation region positioned adjacent to the first diffusion region located in a peripheral part of the electrodes, and forming the first diffusion region of the semiconductor memory elements positioned adjacently in a row extendedly in the direction of a column as one region, the first diffusion region being formed in the element formation region positioned under the isolation region removed previously.

While the novel features of the invention are set forth in a general fashion, both as to organization and content, it will be better understood and appreciated, along with other objects and features thereof, from the following detailed description taken in conjunction with the drawings.

DETAILED DESCRIPTION OF THE PREFERRED EMBODIMENT

Figure 1A:
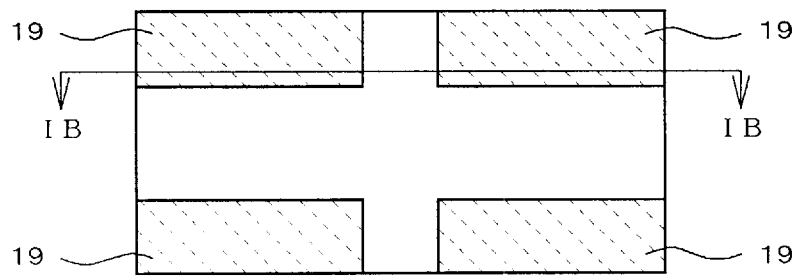
FIG. 1A is a plane view showing a part of manufacturing processes of a nonvolatile memory device 1.
Figure 1B:
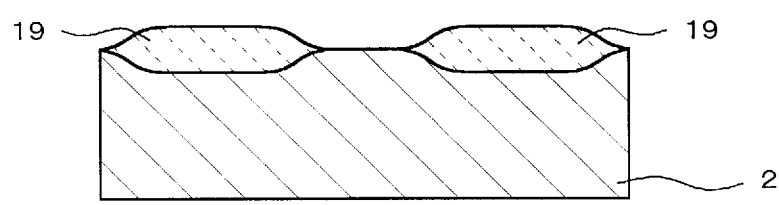
FIG. 1B is a cross-sectional view of a line IB—IB of the nonvolatile memory device 1 under the manufacturing process shown in FIG. 1A.

A manufacturing method of a nonvolatile memory device 1 as a semiconductor memory device in the present invention will be described herein with reference to the figures. Field oxidation layers 19 are formed on portions of a semiconductor substrate 2 as shown in FIG. 1A. FIG. 1B is a cross-sectional view of a line IB—IB of the nonvolatile memory device 1 shown in FIG. 1A.

Figure 1C:
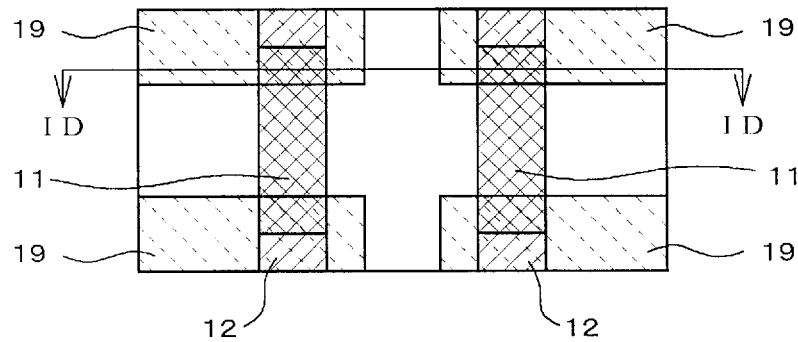
FIG. 1C is a plane view showing a part of manufacturing processes of the nonvolatile memory device 1.
Figure 1D:
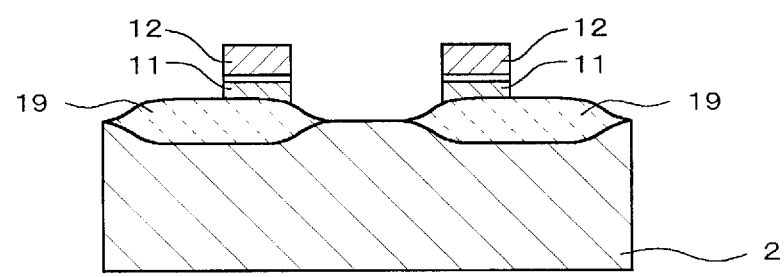
FIG. 1D is a cross-sectional view of a line ID—ID of the nonvolatile memory device 1 under the manufacturing process shown in FIG. 1C.

Thereafter, both floating gate electrodes 11 and control gate electrodes 12 are formed on the field oxidation layers 19 as shown in FIG. 1C. FIG. iD is a cross-sectional view of a line ID—ID of the nonvolatile memory device 1 shown in FIG. 1C.

Figure 2A:
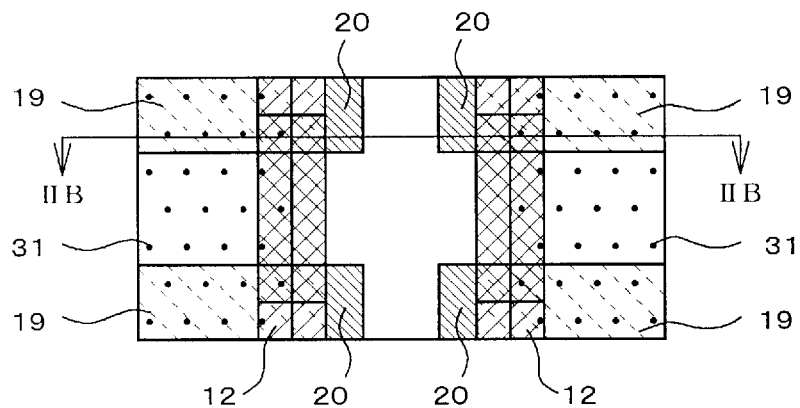
FIG. 2A is a plane view showing a part of manufacturing processes of the nonvolatile memory device 1.

Next, anisotropic etching is carried out by covering all of the regions except a source region by photo-resist layers 31 as shown in FIG. 2A. As a result, side faces of the field oxidation layers 19 made of silicon are exposed adjacent to concave parts 20 formed in the inner sides of the control gate electrodes 12 by carrying out etching of the field oxidation layers 19 partially using the control gate electrodes 12 as a mask, as shown in FIG. 2B.

Figure 2B:
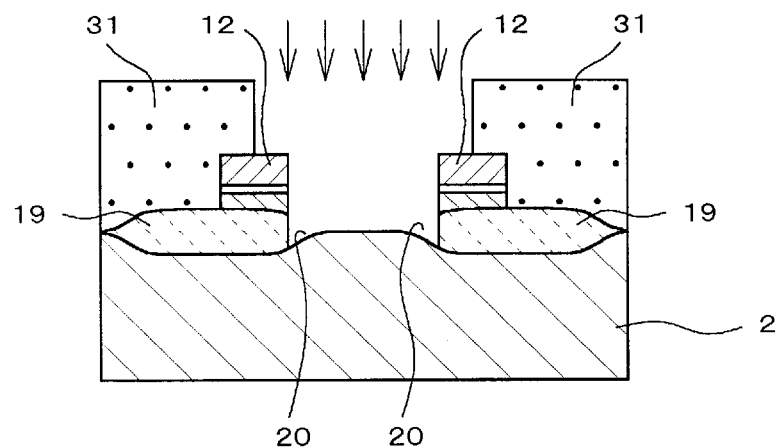
FIG. 2B and FIG. 2C are cross-sectional views of a line IIB—IIB of the nonvolatile memory device 1 under the manufacturing process shown in FIG. 2A.
Figure 2C:
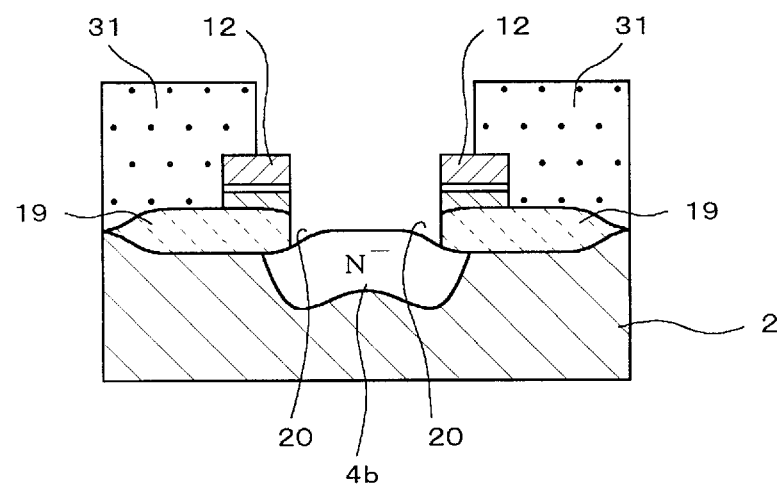

As shown in FIG. 2C, an N⁻ type source region 4b is formed by carrying out ion implantation of N type impurities under the condition shown in FIG. 2B.

Figure 3A:
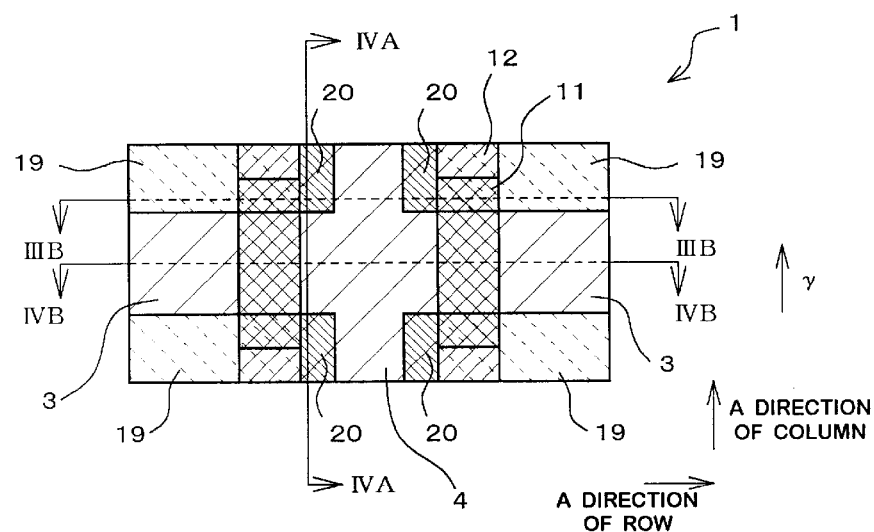
FIG. 3A is a plane view showing a part of manufacturing processes of the nonvolatile memory device 1.

Then, another ion implantation of N type impurities is carried out using the control gate electrodes 12 as a mask after removing the photo-resist layers 31. As a consequence, drain regions 3 and a source region 4 are formed as shown in FIG. 3A.

Figure 3B:
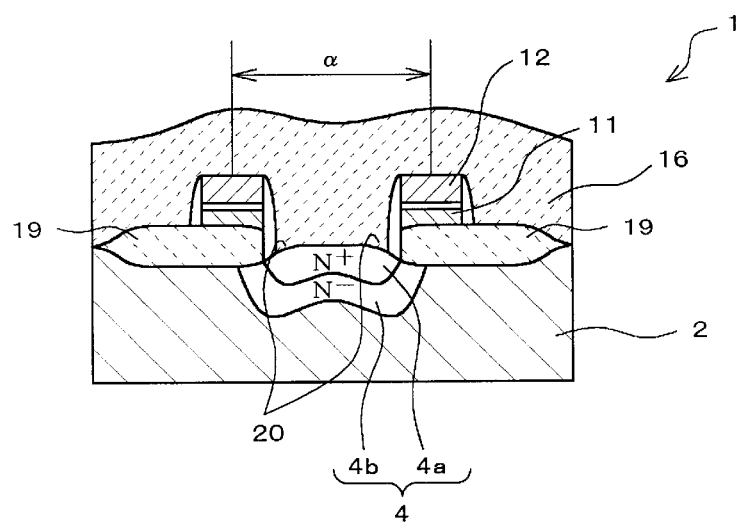
FIG. 3B is a cross-sectional view of a line IIIB—IIIB of the nonvolatile memory device shown in FIG. 3A.

A passivation layer 16 is deposited over the surface as shown in FIG. 3B. FIG. 3B is a cross-sectional view of a line IIIB—IIIB of the nonvolatile memory device shown in FIG. 3A. An aluminum wiring layer for connecting the drain regions 3 is formed upon forming openings (not shown).

Thus, the nonvolatile memory device 1 shown in FIG. 3B is completed. A plurality of the nonvolatile memory devices 1 are arranged in rows and columns as a matrix structure in an active region as element formation regions of the semiconductor substrate 2. The source regions of the nonvolatile memory devices 1 positioned adjacently in a row are formed extendedly in the direction of a column. Also, the control gate electrodes 12 as electrodes of the semiconductor memory elements are formed extendedly in the direction of a column. Therefore, the control gate electrodes 12 are formed on the field oxidation layers 19 as well as on the active regions.

Figure 7A:
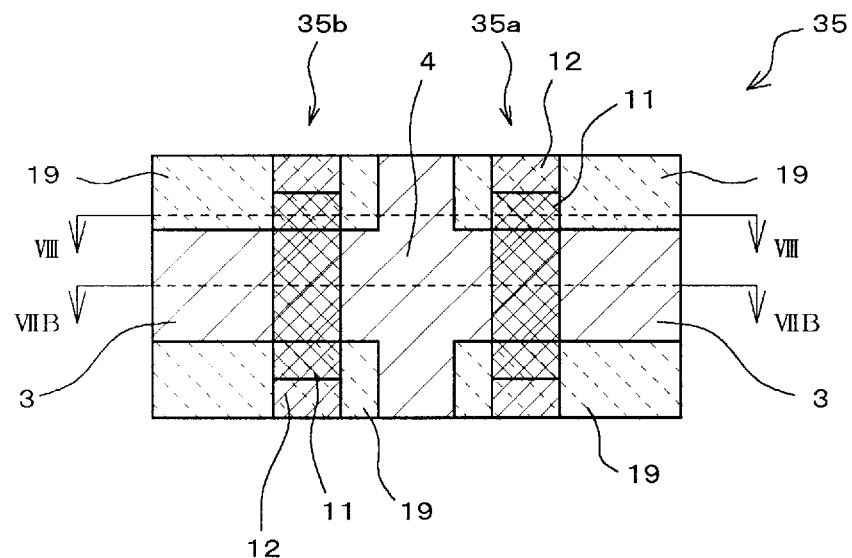
FIG. 7A is a plane view showing a conventional nonvolatile memory 35.
Figure 7B:
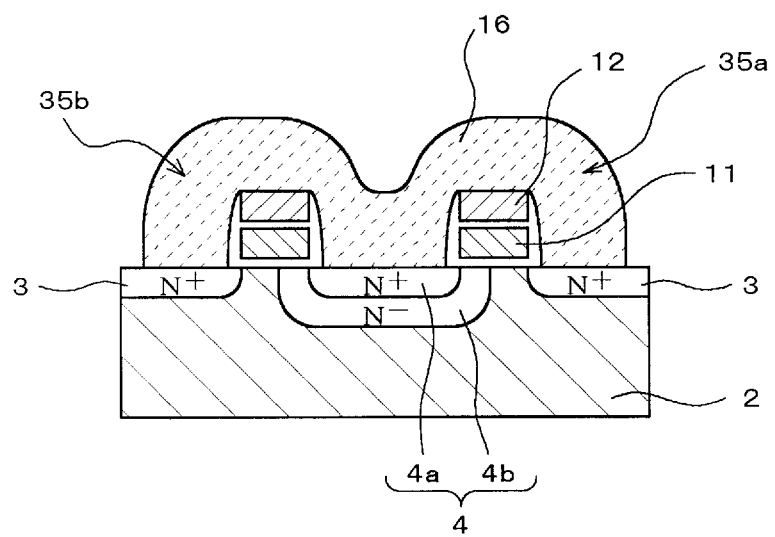
FIG. 7B is a cross-sectional view of a line VIIB—VIIB of the nonvolatile memory shown in FIG. 7A.
Figure 8:
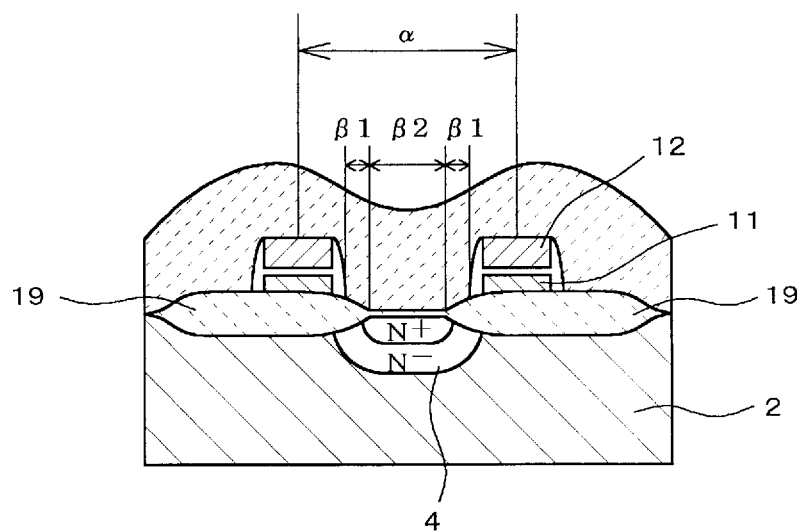
FIG. 8 is a sectional view of a line VIII—VIII of the nonvolatile memory shown in FIG. 7A.

Thus, the source region as a first diffusion region is formed by removing a portion of the field oxidation layers 19 (isolation region) positioned adjacent to the source region in a peripheral part of the control gate electrodes 12. As a result, the source region 4 can be formed narrower than that of the nonvolatile memory device 35 (see FIG. 7, FIG. 8). In other words, the distance α between two of the control gate electrodes positioned adjacently can be reduced for the distance of the concave parts 20. Therefore, it is possible to increase the integration level of the nonvolatile memory devices.

Figure 4A:
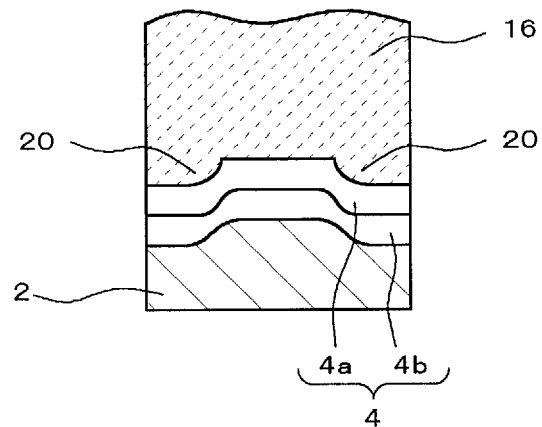
FIG. 4A is a cross-sectional view of a line IVA—IVA of the nonvolatile memory device shown in FIG. 3A.
Figure 4B:
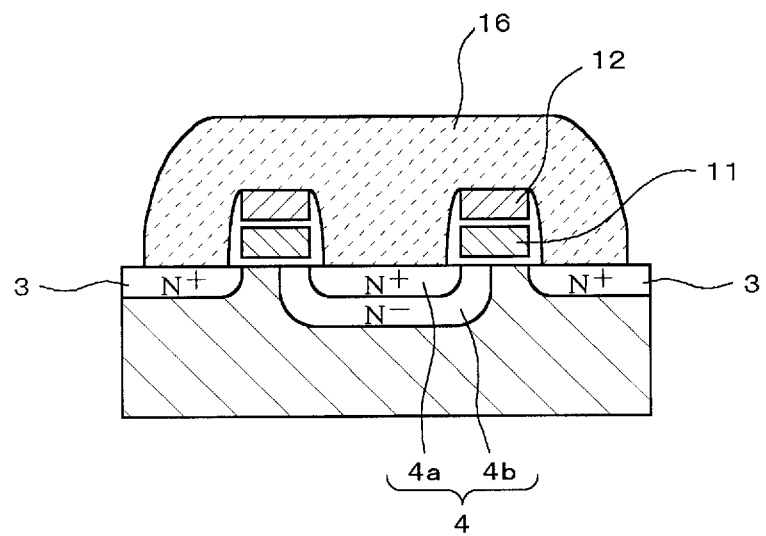
FIG. 4B is a cross-sectional view of a line IVB—IVB of the nonvolatile memory device shown in FIG. 3A.

In addition, the passivation layer 16 can be formed flatly by decreasing the distance a between two of the control gate electrodes positioned adjacently as shown in FIG. 4B. FIG. 4A shows a cross-sectional view of a line IVA—IVA of the nonvolatile memory devices shown in FIG. 3A.

The source region shown in FIG. 3B and FIG. 4B is formed of uniform width in a direction of γ in FIG. 3A without narrowing as in the conventional semiconductor device even in the isolation region. As a result, a semiconductor device having the desired electric resistance of the source region can be provided easily.

Further, the width of the source region 4 is determined by the distance between two of the control gate electrodes positioned adjacently. Therefore, the source region 4 keeps the same width even when a mask for implantation is mis-aligned.

Also, it is possible to provide a nonvolatile memory device having a high integration level. A certain width of margin for the expected narrowed width need not be considered, since the concave parts 20, etched by using the control gates 12 as a mask, are incorporated to the source region 4.

Further, the width of the source region 4 can be formed equally from top to bottom (in direction of γ shown in FIG. 3A) in the nonvolatile memory devices 1 which is different from the conventional nonvolatile memory. Thus, electric resistance of the source region can also be decreased.

As described in the above, a part of the field oxidation layers 19 etched by utilizing the control gate electrodes 12 as a mask can be used as the active region in this embodiment (hereinafter referred to as first embodiment).

In FIG. 3A, hatching is used for clarifying each of the parts, not for showing sections of the parts.

Although, the field oxidation layers 19 are formed so as to compose a source line extended in the direction of a column before forming the concave parts 20 in the first embodiment, it is possible to form the source line extendedly in the direction of a column while carrying out etching in order to form the concave parts 20. Other manufacturing processes of the source line are described hereunder with reference to FIG. 5 and FIG. 6.

Figure 5A:
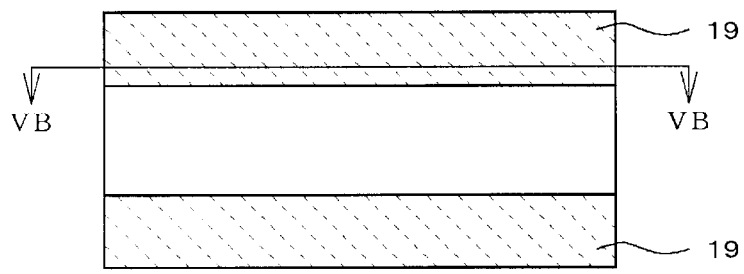
FIG. 5A is a plane view showing a part of manufacturing processes of the nonvolatile memory device in another embodiment.
Figure 5B:
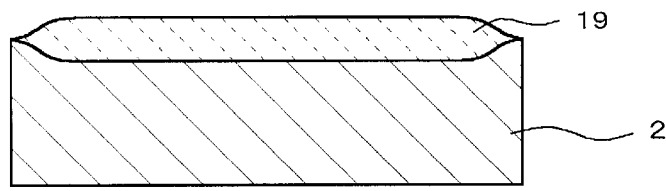
FIG. 5B is a cross-sectional view of a line VB—VB of the nonvolatile memory device under the manufacturing process shown in FIG. 5A.
Figure 5C:
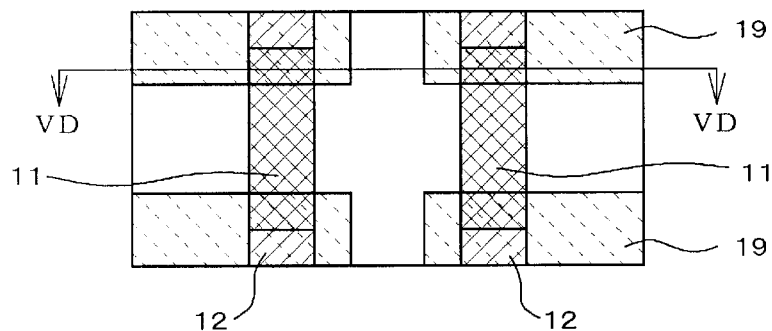
FIG. 5C is a plane view showing a part of manufacturing processes of the nonvolatile memory device in another embodiment.

Initially, device isolation is carried out by forming the field oxidation layers 19 in a part of the semiconductor substrate 2 as shown in FIG. 5A. FIG. 5B is a cross-sectional view of a line VB—VB of the nonvolatile memory device shown in FIG. 5A. Then, both the floating gate electrodes 11 and the control gate electrodes 12 are formed on the field oxidation layers 19 as shown in FIG. 5C.

Figure 5D:
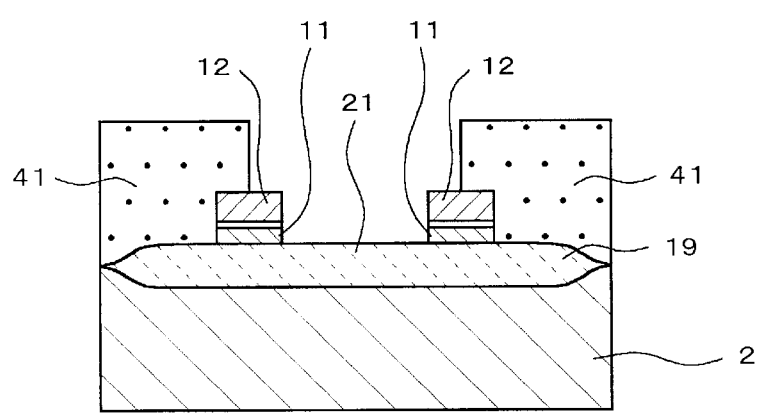
FIG. 5D is a cross-sectional view of a line VD—VD of the nonvolatile memory device under the manufacturing process shown in FIG. 5C.
Figure 6A:
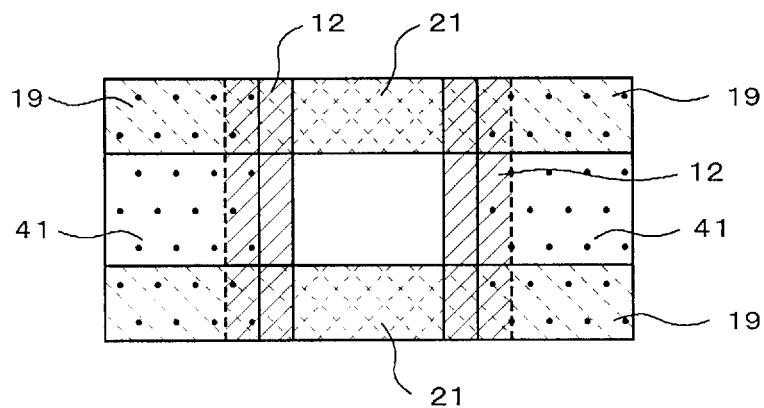
FIG. 6A is a plane view showing a part of manufacturing processes of the nonvolatile memory device in another embodiment.
Figure 6B:
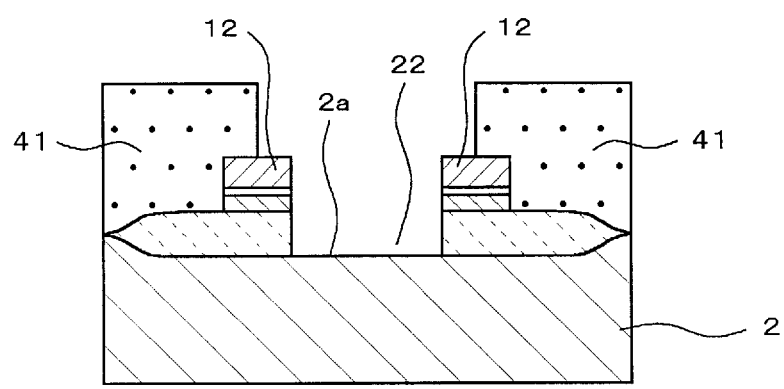
FIG. 6B is a cross-sectional view of the nonvolatile memory device under the manufacturing process shown in FIG. 6A.

Thereafter, the surface is covered with photoresist layers 41 except for a region to be the source region as shown in FIG. 5D and FIG. 6A. A part of the field oxidation layers 19 are removed from the condition shown in FIG. 5D and FIG. 6A by carrying out anisotropic etching utilizing the control gate electrodes 12 as a mask, as shown in FIG. 6B. As a result of the etching, a surface 2a of the field oxidation layers 19 made of silicon, is removed from concave parts 22 formed in the inner sides of the control gate electrodes 12 by carrying out etching of the field oxidation layers 19 partially using the control gate electrodes 12 as a mask.

Figure 6C:
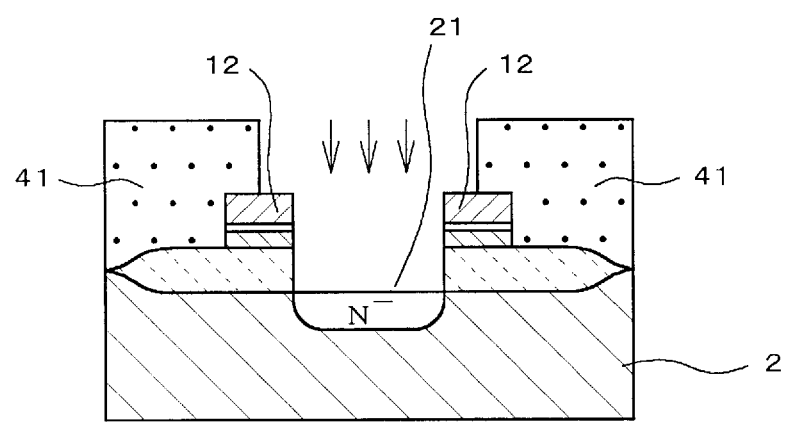
FIG. 6C is a cross-sectional view of the nonvolatile memory device under another process.

Ion implantation of N type impurities is carried out at the condition shown in FIG. 6B, so that an N⁻ type source region 4b is formed as shown in FIG. 6C. The manufacturing processes which need to be done further to above are the same as in the first embodiment.

The size of the nonvolatile memory device resulting from forming the source line as described above is smaller than that of the nonvolatile memory device formed by the first embodiment. Also, stable electrical characteristics can be realized by the nonvolatile memory device formed in this embodiment by suppressing variation of the source line length.

The present invention is applied to a semiconductor so called "flash memory" in both of the embodiments described in the above. Application of the present invention is not limited to the flash memory.

The present invention can be applied to any other semiconductor device having control gate electrodes formed extendedly in the direction of a column as one electrode, and a source region formed extendedly in the direction of a column as one region. In other words, the present invention can be applied to a semiconductor device having a plurality of semiconductor memory elements arranged in rows and columns as a matrix structure in a semiconductor substrate divided into a plurality of element formation regions by the isolation region, and the first diffusion of the semiconductor memory elements positioned adjacently in the direction of a row formed extendedly in the direction of a column as one region.

A part of the field oxidation layers is etched by using the electrodes as a mask before forming the first diffusion region in the manufacturing method of the semiconductor device in the present invention. As a result, a part of the isolation region positioned adjacent to the first diffusion region located in a peripheral part of the electrodes is removed. Thereafter, the second conductive layer can be formed until it reaches to the vicinity of the electrodes in the isolation region by forming the second conductive region using the electrodes as a mask. Therefore, the distance between the electrodes positioned adjacently through the second conductive region can be reduced by the distance of the isolation region thus removed. By doing that, it is possible to increase the integration level of the nonvolatile memory devices, as well as to flatly form the passivation layer.

Further, the second conductive region in the direction of a row can be formed of substantially uniform width in the isolation region and the element formation region. As a result, design work of the second conductive region can be carried out easily.

In addition, the first diffusion region is formed by removing a part of the isolation region positioned adjacent to the first diffusion region in a peripheral part of the electrodes formed extendedly in the direction of a column. As a result, the first diffusion region can be formed until it reaches the vicinity of the electrodes even in the isolation region. Therefore, the distance between the electrodes positioned adjacently through the first diffusion region can be reduced by the distance of the isolation region thus removed. By doing that, it is possible to increase the integration level of the nonvolatile memory device, as well as to flatly form the passivation layer.

While the invention has been described in its preferred embodiments, it is to be understood that the words which have been used are words of description rather than limitation and that changes within the purview of the appended claims may be made without departing from the true scope and spirit of the invention in its broader aspects.

What is claimed is:

1. A semiconductor memory device, comprising:
   a plurality of semiconductor memory elements arranged in directions of rows and columns as matrix structure in a semiconductor substrate divided into a plurality of element formation regions by isolation regions;

a first diffusion region of the semiconductor memory elements positioned adjacently in the direction of the rows being formed extendedly in the direction of the columns as one region;

electrodes of the semiconductor memory elements arranged in the direction of the columns and formed extendedly in the direction of the columns as one electrode;

isolation regions having side faces in the vicinity of the electrodes said side faces being formed by carrying out etching of the isolation regions using the electrodes as a mask, said side faces being adjacent to the first diffusion region wherein said first diffusion region is formed to have substantially uniform width in the direction of the rows.

2. A semiconductor memory device in accordance with claim 1, wherein the first diffusion region is formed as a source region.

3. A semiconductor memory device in accordance with claim 1, wherein the electrodes are formed as control gate electrodes, and wherein floating gate electrodes are formed under the control gate electrodes through insulation layers in each of the semiconductor memory elements.

* * * * *